United States Patent
Boettiger et al.

(10) Patent No.: US 9,699,393 B2
(45) Date of Patent: Jul. 4, 2017

(54) IMAGING SYSTEMS FOR INFRARED AND VISIBLE IMAGING WITH PATTERNED INFRARED CUTOFF FILTERS

(71) Applicant: Aptina Imaging Corporation, George Town, Grand Cayman (KY)

(72) Inventors: Ulrich Boettiger, Garden City, CA (US); Richard Scott Johnson, Boise, ID (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 273 days.

(21) Appl. No.: 14/316,648

(22) Filed: Jun. 26, 2014

(65) Prior Publication Data

US 2015/0381907 A1    Dec. 31, 2015

(51) Int. Cl.
*H04N 5/33* (2006.01)
*H01L 31/0232* (2014.01)
*H01L 27/146* (2006.01)

(52) U.S. Cl.
CPC ....... *H04N 5/332* (2013.01); *H01L 27/14621* (2013.01); *H01L 27/14625* (2013.01); *H01L 27/14627* (2013.01); *H01L 27/14643* (2013.01); *H01L 31/02327* (2013.01); *H01L 27/1464* (2013.01)

(58) Field of Classification Search
CPC .............. H04N 5/332; H01L 27/14621; H01L 27/14625; H01L 27/14627; H01L 27/14643; H01L 31/02327
See application file for complete search history.

(56) References Cited

U.S. PATENT DOCUMENTS

| 7,990,447 B2 | 8/2011 | Honda et al. |
| 2005/0134697 A1 | 6/2005 | Mikkonen et al. |
| 2008/0121442 A1* | 5/2008 | Boer ............... G06F 3/0412 178/18.09 |
| 2010/0102206 A1 | 4/2010 | Cazaux et al. |
| 2011/0001814 A1* | 1/2011 | Yamanaka ............ A61B 5/117 348/78 |

(Continued)

OTHER PUBLICATIONS

Agranov et al., U.S. Appl. No. 13/777,776, filed Feb. 26, 2013.
Jin, U.S. Appl. No. 14/470,841, filed Aug. 27, 2014.

*Primary Examiner* — Tat Chio
(74) *Attorney, Agent, or Firm* — Treyz Law Group, P.C.; Kendall W. Abbasi; Joseph F. Guihan

(57) ABSTRACT

An image sensor may include a pixel array having visible and infrared imaging pixels for simultaneously detecting light in the visible and infrared spectral ranges. The pixel array may include an array of photodiodes, an array of filter elements formed over the photodiodes, and an array of microlenses formed over the array of filter elements. The filter elements may include infrared cutoff filter elements that block infrared light while passing visible light. The infrared cutoff filter elements may be formed from a patterned layer of infrared blocking material. Each visible imaging pixel includes a portion of the infrared blocking material and a color filter element. Each infrared imaging pixel is aligned with an opening in the infrared blocking material. The opening may be filled with an infrared pass filter element that passes infrared light while blocking visible light.

12 Claims, 5 Drawing Sheets

(56) References Cited

U.S. PATENT DOCUMENTS

| | | | |
|---|---|---|---|
| 2012/0146172 A1* | 6/2012 | Carey | H01L 27/14629 |
| | | | 257/443 |
| 2012/0154596 A1 | 6/2012 | Wajs | |
| 2013/0222546 A1* | 8/2013 | Takahashi | H01L 27/14623 |
| | | | 348/46 |
| 2013/0271437 A1* | 10/2013 | Webster | G09G 3/2003 |
| | | | 345/207 |
| 2014/0078356 A1* | 3/2014 | Vaartstra | H01L 27/14629 |
| | | | 348/273 |
| 2015/0146144 A1* | 5/2015 | Yang | G02F 1/136209 |
| | | | 349/106 |

\* cited by examiner

IMAGING SYSTEMS FOR INFRARED AND VISIBLE IMAGING WITH PATTERNED INFRARED CUTOFF FILTERS

BACKGROUND

This relates generally to imaging devices, and more particularly, to imaging devices with both visible and infrared imaging capabilities.

Modern electronic devices such a cellular telephones, cameras, and computers often use digital image sensors. Imagers (i.e., image sensors) may be formed from a two-dimensional array of image sensing pixels. Each pixel may include a photosensor such as a photodiode that receives incident photons (light) and converts the photons into electrical signals. Image sensors are sometimes designed to provide images to electronic devices using a Joint Photographic Experts Group (JPEG) format or any other suitable image format.

Imaging devices may be configured to capture images in both the infrared spectral range as well as the visible spectral range. Infrared imaging can be used for a number of different applications such as three-dimensional (3D) imaging, automatic focusing, and other applications. In conventional image sensors, however, it can be difficult to separate signals corresponding to infrared light from signals corresponding to visible light. If care is not taken, infrared light received by color pixels in the image sensor can degrade the quality of images captured in the visible spectrum.

An infrared cutoff filter is sometimes placed in front of the image sensor to prevent infrared light from striking the image sensor. In order to capture images in the infrared spectral range, a separate imaging sensor is used for infrared imaging. However, the use of two separate imaging sensors is costly and can add undesirable bulk to an electronic device.

It would therefore be desirable to be able to provide improved imaging devices for capturing images in the infrared and visible spectral ranges.

DETAILED DESCRIPTION

Electronic devices such as digital cameras, computers, cellular telephones, and other electronic devices include image sensors that gather incoming image light to capture an image. The image sensors may include arrays of imaging pixels. The pixels in the image sensors may include photosensitive elements such as photodiodes that convert the incoming image light into image signals. Image sensors may have any number of pixels (e.g., hundreds or thousands or more). A typical image sensor may, for example, have hundreds of thousands or millions of pixels (e.g., megapixels). Image sensors may include control circuitry such as circuitry for operating the imaging pixels and readout circuitry for reading out image signals corresponding to the electric charge generated by the photosensitive elements.

Figure 1:
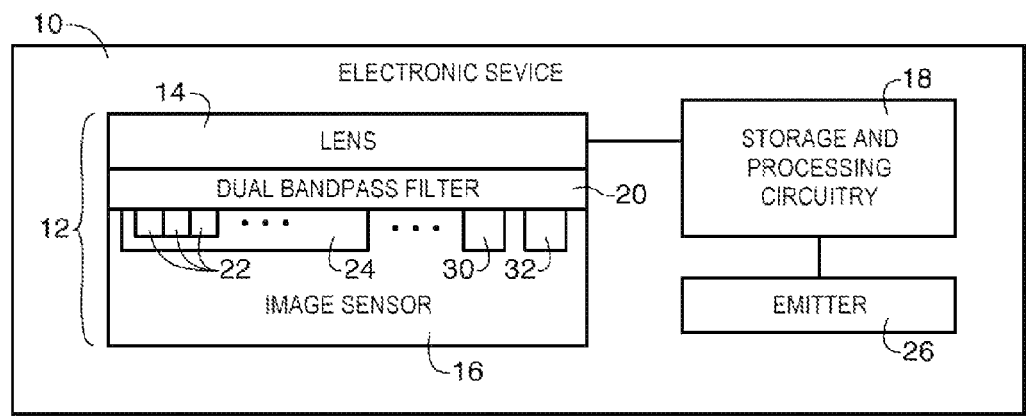
FIG. 1 is a diagram of an illustrative electronic device having a camera module in accordance with an embodiment of the present invention.

FIG. 1 is a diagram of an illustrative electronic device that uses an image sensor to capture images. Electronic device 10 of FIG. 1 may be a portable electronic device such as a camera, a cellular telephone, a video camera, or other imaging device that captures digital image data. Camera module 12 may be used to convert incoming light into digital image data. Camera module 12 may include one or more lenses 14 and one or more corresponding image sensors 16. Image sensor 16 may be an image sensor system-on-chip (SOC) having additional processing and control circuitry such as analog control circuitry and digital control circuitry on a common image sensor integrated circuit die with an image pixel array.

During image capture operations, light from a scene may be focused onto an image pixel array (e.g., array 24 of image pixels 22) by lens 14. Image sensor 16 provides corresponding digital image data to analog circuitry 30. Analog circuitry 30 may provide processed image data to digital circuitry 32 for further processing. Circuitry 30 and/or 32 may also be used in controlling the operation of image sensor 16. Image sensor 16 may be a backside illumination image sensor or may, if desired, be a front side illumination image sensor. If desired, camera module 12 may be provided with an array of lenses 14 and an array of corresponding image sensors 16.

Device 10 may include additional control circuitry such as storage and processing circuitry 18. Circuitry 18 may include one or more integrated circuits (e.g., image processing circuits, microprocessors, storage devices such as random-access memory and non-volatile memory, etc.) and may be implemented using components that are separate from camera module 12 and/or that form part of camera module 12 (e.g., circuits that form part of an integrated circuit that includes image sensors 16 or an integrated circuit within module 12 that is associated with image sensors 16). Image data that has been captured by camera module 12 may be further processed and/or stored using processing circuitry 18. Processed image data may, if desired, be provided to external equipment (e.g., a computer or other device) using wired and/or wireless communications paths coupled to processing circuitry 18. Processing circuitry 18 may be used in controlling the operation of image sensors 16.

Image sensors 16 may include one or more arrays 24 of image pixels 22. Image pixels 22 may be formed in a semiconductor substrate using complementary metal-oxide-semiconductor (CMOS) technology or charge-coupled device (CCD) technology or any other suitable photosensitive device technology.

A filter such as dual bandpass filter 20 may be interposed between lens 14 and image sensor 16. Filter 20 may, for example, be a bandpass coating filter that includes multiple layers of coating on a glass substrate. Using a process of constructive and destructive interference, filter 20 may be configured to pass a first band of wavelengths corresponding to visible light and a second narrow band of wavelengths corresponding to near infrared light.

Filter 20 may allow image sensor 16 to capture images in the visible spectral range and in the infrared spectral range. For example, device 10 may include an emitter such as infrared emitter 26. Infrared emitter 26 may be an infrared laser that is used to illuminate a scene with near infrared light. The light generated by emitter 26 may be structured light having a wavelength that falls within the second narrow passband of filter 20. Infrared light that is reflected from a scene towards image sensor 16 will pass through filter 20 and will be detected by infrared imaging pixels in pixel array 24. This is, however, merely illustrative. If desired, infrared imaging pixels in pixel array 24 may detect infrared light that is not generated by emitter 26.

Figure 2:
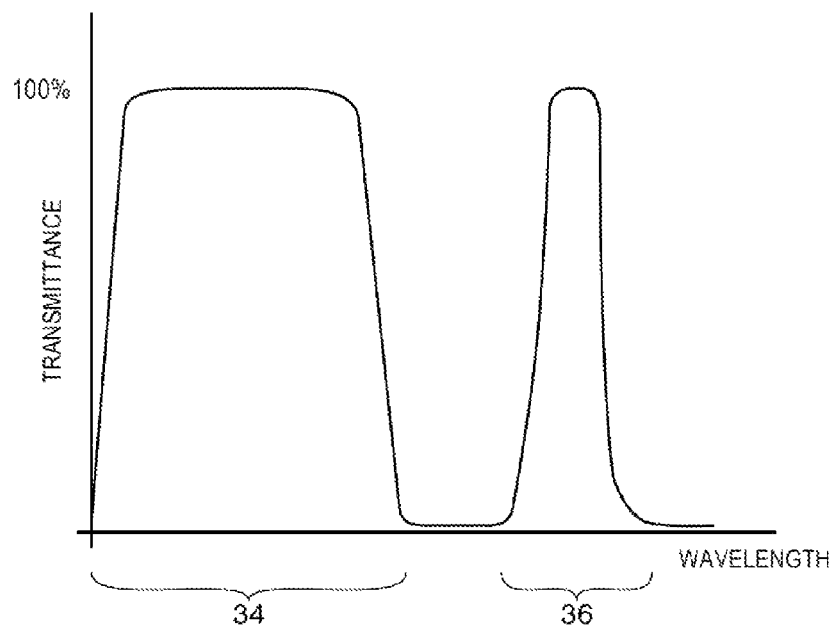
FIG. 2 is a graph showing the spectral response of a dual bandpass filter that may be used in a camera module of the type shown in FIG. 1 in accordance with an embodiment of the present invention.

A graph showing the spectral response of dual bandpass filter 20 is shown in FIG. 2. As shown in FIG. 2, dual bandpass filter 20 may have a first passband such as passband 34 in the visible spectral range and a second narrow passband such as passband 36 in the infrared spectral range. First passband 34 may correspond to wavelengths ranging from about 390 to about 700 nanometers, whereas second passband 36 may correspond to wavelengths ranging from about 830 to about 870 nanometers, about 830 to about 930 nanometers, or may correspond to other suitable ranges of wavelengths in the infrared spectral range (as examples).

In conventional image sensors that include both visible and infrared imaging pixels, the infrared imaging pixels are provided with an infrared filter that passes infrared light and blocks visible light. The visible imaging pixels are typically provided with color filters such as red, green, and blue color filters that are optimized to pass light of a particular color. However, color filters often exhibit some transmittance in the infrared spectral range as well, and it be difficult to separate the infrared portion of the pixel signal from the visible portion of the pixel signal. This is sometimes done by relying on pixel signals from the infrared imaging pixels to remove the infrared portion of pixel signals from the visible imaging pixels. However, this method is not always accurate and can degrade the quality of images in the visible spectrum.

The difficult process of accurately removing the infrared portion of pixel signals from visible imaging pixels can be avoided altogether by providing structures that prevent infrared light from reaching the visible imaging pixels. An infrared cut-off filter is sometimes placed in front of the image sensor to prevent infrared light from striking the image sensor. However, this requires a separate image sensor to be used for infrared imaging, which is both costly and undesirable for small form factor devices.

Figure 3:
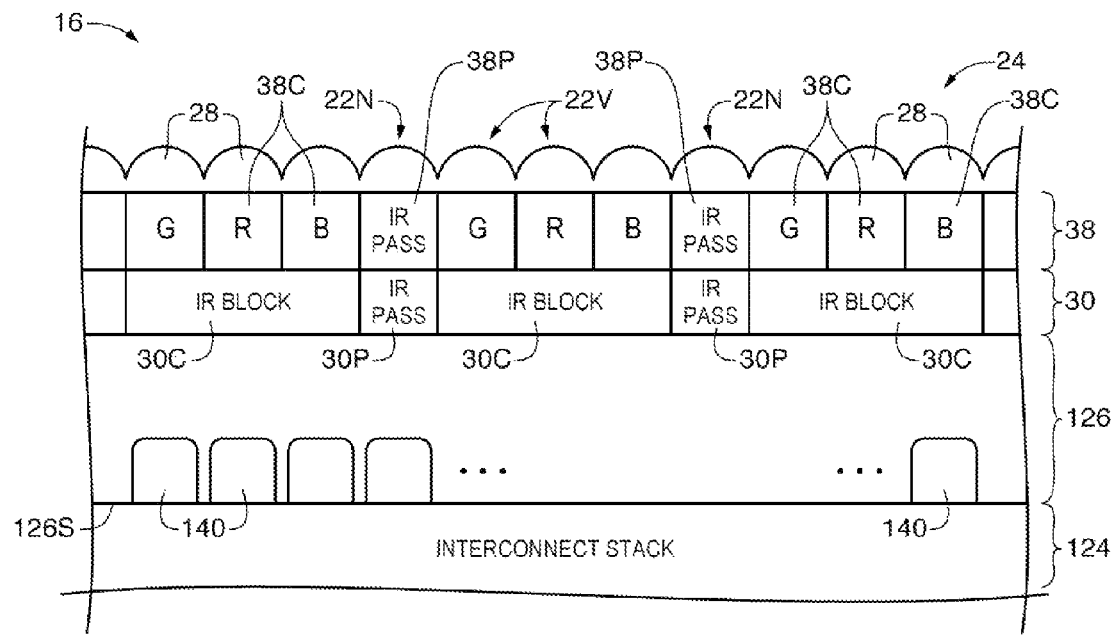
FIG. 3 is a cross-sectional side view of a portion of an illustrative image sensor having a patterned infrared cutoff filter formed below a color filter array in accordance with an embodiment of the present invention.

To provide both visible and infrared imaging with a single image sensor without compromising the quality of images in the visible spectral range, the visible imaging pixels in pixel array 24 may include both color filters that pass visible light and infrared cutoff filters that pass visible light while blocking infrared light. A cross-sectional side view of image sensor 16 illustrating how pixel array 24 may include patterned infrared cutoff filters is shown in FIG. 3. As shown in FIG. 3, pixel array 24 may include visible imaging pixels 22V and infrared imaging pixels 22N. Each imaging pixel may include a photosensitive element such as a photodiode 140 and a microlens such as microlens 28. Each microlens may be configured to direct light from a scene towards an associated photodiode 140.

Photodiodes 140 may be formed in surface 126S of substrate layer 126 (e.g., a p-type silicon substrate). Other pixel structures (e.g., floating diffusion regions, pixel transistors, etc.) may also be formed in surface 126S of substrate 126. A dielectric stack such as dielectric stack 124 may be formed on surface 126S of substrate 126. Dielectric stack 124 may be formed from dielectric material such as silicon oxide or other dielectric material. Interconnect routing structures such as conductive signal routing paths and conductive vias may be formed in dielectric stack 124 to contact the various pixel transistor terminals in substrate 126. Dielectric stack 124 may therefore sometimes be referred to as an interconnect stack.

A filter array such as filter array 38 may be interposed between microlenses 28 and substrate 126. Filter array 38 may include color filter elements 38C that pass light of one or more colors in the visible spectrum and infrared pass filter elements 38P that pass light in the infrared spectrum while blocking light in the visible spectrum. Infrared filter elements 38P may be formed from a black photodefinable polymer or other suitable material (e.g., an infrared pass filter material) that exhibits strong absorption of light in the visible spectral range while transmitting light in the infrared spectral range. Color filter elements 38C may include red color filter elements (e.g., color filter material that passes red light while reflecting and/or absorbing other colors of light), blue color filter elements (e.g., color filter material that passes blue light while reflecting and/or absorbing other colors of light), green color filter elements (e.g., color filter material that passes green light while reflecting and/or absorbing other colors of light), yellow color filter elements (e.g., yellow color filter material that passes red and green light), clear color filter elements (e.g., transparent material that passes red, blue, and green light), and/or color filter elements of other colors (e.g., cyan, magenta, etc.).

Each filter element in filter array 38 may overlap a corresponding photodiode 140. For example, color filter elements 38C may overlap photodiodes 140 of visible imaging pixels 22V, and infrared pass filter elements 38P may overlap photodiodes 140 of infrared imaging pixels 22N.

To prevent infrared light that passes through color filter elements 38C from reaching photodiodes 140 of visible imaging pixels 22V, pixel array 24 may include an additional layer of filter elements 30. Layer 30 may include infrared cutoff filter elements 30C and infrared pass elements 30P. Infrared cutoff filter elements 30C (sometimes referred to as infrared blocking material 30C) may be formed in visible imaging pixels 22V and may be configured to block transmission of infrared light while passing all wavelengths of visible light. Infrared pass portions 30P of layer 30 may be formed in infrared imaging pixels 22N and may, if desired, be formed from the same material as infrared pass elements 38P of filter array 38.

Filter layers 38 and 30 of FIG. 3 may be formed using photolithographic techniques. For example, layer 30 may be formed by depositing a blanket layer of infrared cutoff filter material (e.g., a photoimageable polymer) on substrate 126 and then patterning the layer photolithographically to form the desired pattern of infrared cutoff filter elements 30C on substrate 126 (e.g., to form openings in the infrared cutoff filter material in regions corresponding to infrared imaging pixels 22N and to form infrared cutoff filter elements 30C in regions corresponding to visible imaging pixels 22V). Layer 38 may be formed in a similar manner (e.g., by depositing and patterning layers of color filter material to form color filter elements 38C and infrared pass material to form infrared pass elements 38P). If desired, infrared pass elements 30P and infrared pass elements 38P may be formed in the same processing step.

Figure 4:
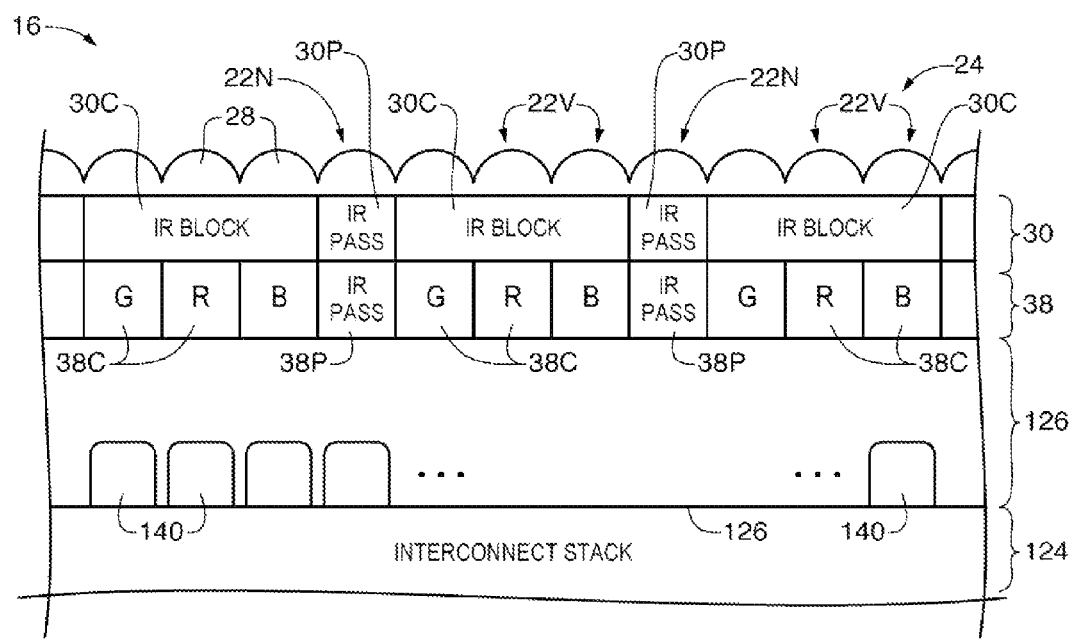
FIG. 4 is a cross-sectional side view of a portion of an illustrative image sensor having a patterned infrared cutoff filter formed above a color filter array in accordance with an embodiment of the present invention.

The example of FIG. 3 in which infrared cutoff elements 30C are interposed between color filter elements 38C and photodiodes 140 is merely illustrative. If desired, color filter elements 38C may be formed below infrared cutoff elements 30C. For example, as shown in FIG. 4, filter layer 38 may be interposed between filter layer 30 and photodiodes 140. Layer 38 may be formed by depositing and patterning color filter elements 38C and infrared pass elements 38P on substrate 126, and layer 30 may be formed by depositing and patterning infrared cutoff filter elements 30C and infrared pass elements 30P over layer 38. If desired, infrared pass elements 30P and infrared pass elements 38P may be formed in the same processing step.

If desired, infrared light blocking material 30C may be integrated with color filter material 38C rather than being deposited as a separate layer under or over color filter material 38C. In this type of arrangement, each color filter element 38C would block the transmission of infrared light while passing a band of wavelengths corresponding to a particular color.

The examples of FIGS. 3 and 4 in which image sensor 16 is a backside illumination image sensor are merely illustrative. If desired, image sensor 16 may be a front side illumination image sensor (e.g., in which interconnect stack 124 is interposed between substrate 126 and filter layers 30 and 38).

Figure 5:
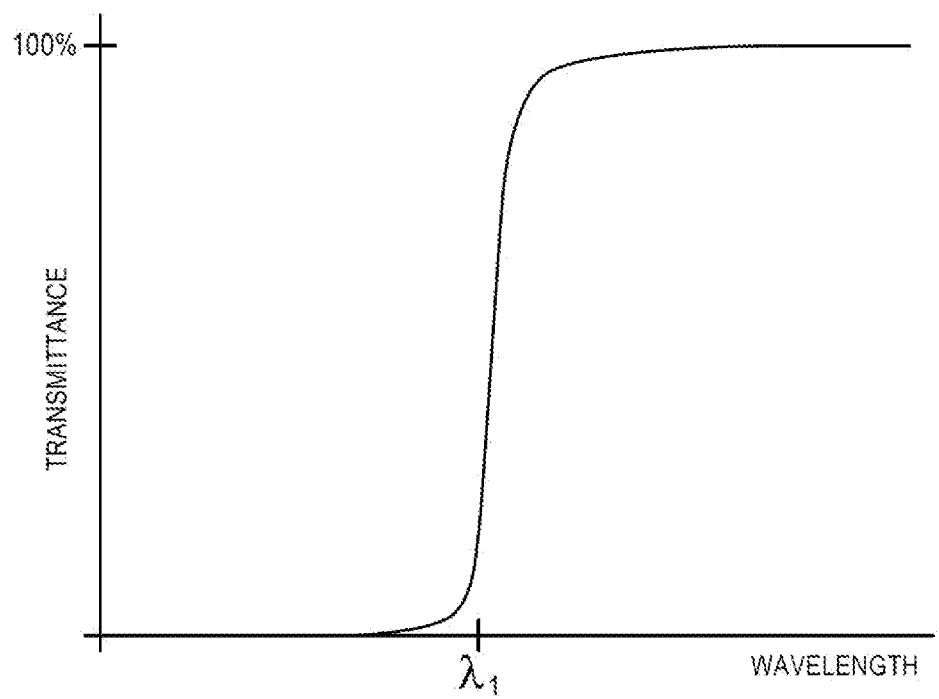
FIG. 5 is a graph showing the spectral response of an infrared pass filter element that may be used in infrared imaging pixels in accordance with an embodiment of the present invention.

A graph showing the spectral response of infrared pass elements 30P and 38P is shown in FIG. 5. As shown in FIG. 5, infrared pass elements 30P and 38P block wavelengths of light below $\lambda_1$ (e.g., visible light) and pass wavelengths of light above $\lambda_1$ (e.g., infrared light). Wavelength $\lambda_1$ may, for example, be between 750 nm and 850 nm (as an example). The use of infrared pass elements 30P and 38P in infrared imaging pixels 22N ensures that visible light is not transmitted to photodiodes 140 of infrared imaging pixels 22N.

Figure 6:
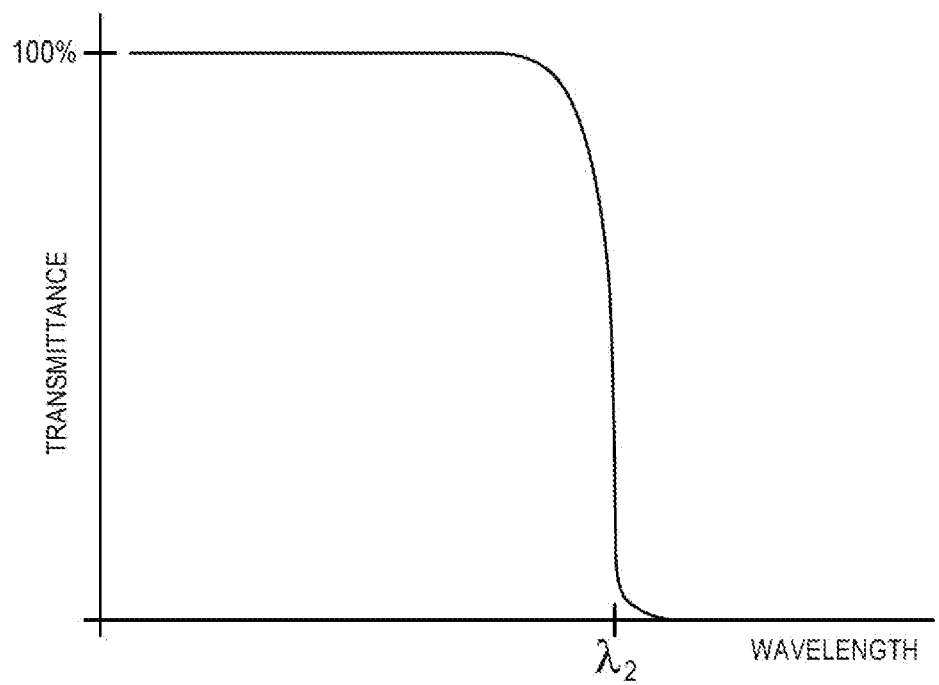
FIG. 6 is a graph showing the spectral response of an infrared cutoff filter element that may be used in visible imaging pixels in accordance with an embodiment of the present invention.

A graph showing the spectral response of infrared cutoff elements 30C is shown in FIG. 6. As shown in FIG. 6, infrared cutoff elements 30C block wavelengths of light above $\lambda_2$ (e.g., infrared light) while passing wavelengths of light below $\lambda_2$ (e.g., visible light). Wavelength $\lambda_2$ may, for example, be between 800 nm and 900 nm (as an example). The use of infrared light blocking material 30C in visible imaging pixels 22V ensures that infrared light is not transmitted to photodiodes 140 of visible imaging pixels 22V. In configurations where infrared cutoff elements 30C are integrated with color filter elements 38C, the passband in the visible spectrum (below $\lambda_2$) would be a narrower passband corresponding to a particular color of light (e.g., red, green, or blue).

By using a patterned layer of infrared light blocking material 30C in image sensor SOC 16 (as opposed to a blanket infrared cutoff filter that covers the entire image sensor), infrared light may be selectively blocked in some portions of pixel array 24 and selectively allowed to pass in other portions of pixel array 24.

Figure 7:
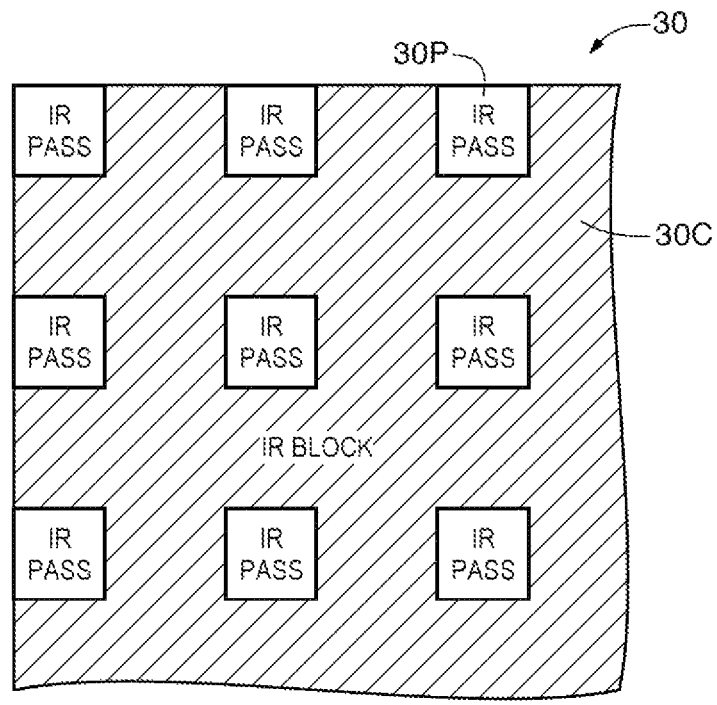
FIG. 7 is a top view of an illustrative layer of infrared light blocking material that is patterned to include a plurality of openings for allowing infrared light to reach infrared imaging pixels in a pixel array in accordance with an embodiment of the present invention.

An illustrative pattern for infrared light blocking material 30C of FIGS. 3 and 4 is shown in FIG. 7. As shown in FIG. 7, layer 30 may include a blanket layer of infrared light blocking material 30C with openings for accommodating infrared pass material 30P. In this example, openings for infrared pass material 30P are distributed uniformly throughout layer 30. This type of pattern may be used in conjunction with a filter array 38C having a "quasi-Bayer" pattern in which each 2×2 block of filter elements includes a green color filter element, a red color filter element, a blue color filter element, and a near infrared filter element in the place where a green color filter element would be located in a typical Bayer array. Infrared blocking material 30C of FIG. & may overlap the red, green, and blue color filter elements, whereas infrared pass elements 30P may overlap the near infrared filter elements. This is, however, merely illustrative. If desired, infrared pixels 22N (and corresponding openings in infrared light blocking material 30C) may be arranged in any fashion in pixel array 24.

Figure 8:
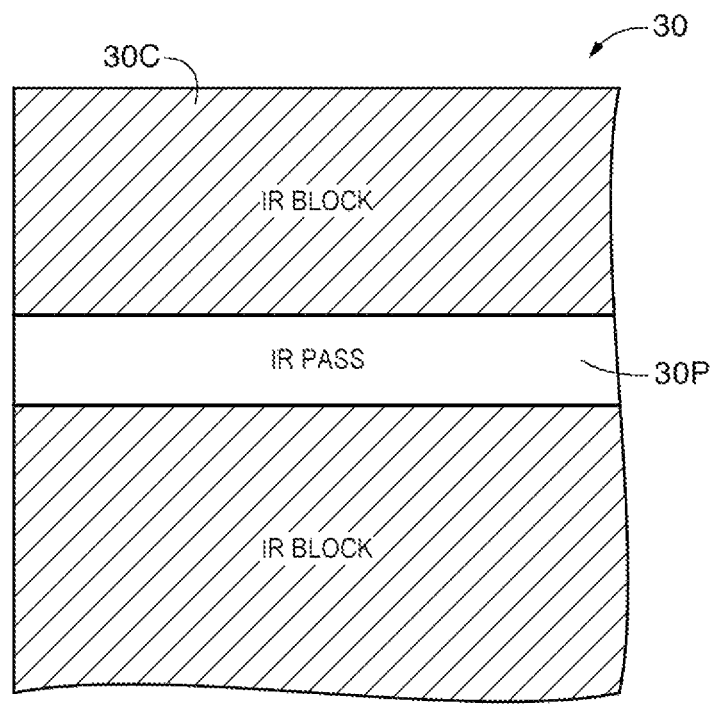
FIG. 8 is a top view of an illustrative layer of infrared light blocking material that is patterned to include an opening for allowing infrared light to reach infrared imaging pixels arranged consecutively in a line in accordance with an embodiment of the present invention.

Infrared pass portions 30P may, for example, span across more than on pixel. As shown in FIG. 8, for example, layer 30 includes a blanket layer of infrared blocking material 30C with a contiguous opening that spans across multiple pixels in a line. This type of arrangement may be used in a pixel array that includes multiple infrared pixels arranged consecutively in a line (e.g., a horizontal or vertical line that spans across the entire pixel array or a portion of the pixel array). In general, near infrared pixels may be arranged in pixel array 24 in any suitable pattern. The examples of FIGS. 7 and 8 are merely illustrative.

Figure 9:
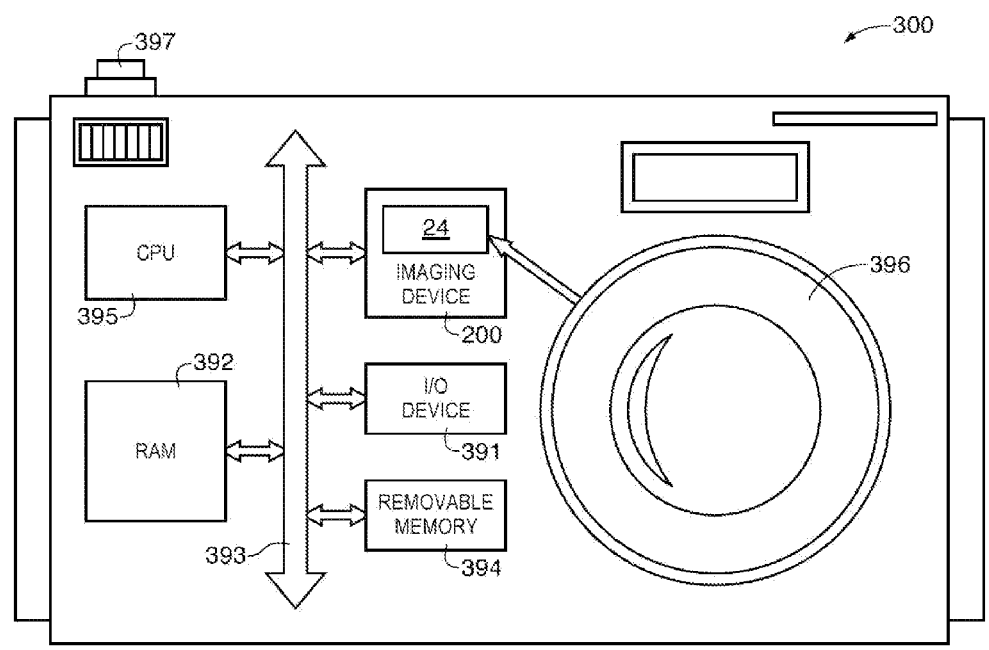
FIG. 9 is a block diagram of a system employing the embodiments of FIGS. 1-8 in accordance with an embodiment of the present invention.

FIG. 9 shows in simplified form a typical processor system 300, such as a digital camera, which includes an imaging device 200. Imaging device 200 may include a pixel array 24 of the type shown in FIG. 1 formed on an image sensor SOC. Pixel array 24 may include visible and infrared imaging pixels and a patterned infrared light blocking material as described above. Processor system 300 is exemplary of a system having digital circuits that may include imaging device 200. Without being limiting, such a system may include a computer system, still or video camera system, scanner, machine vision, vehicle navigation, video phone, surveillance system, auto focus system, star tracker system, motion detection system, image stabilization system, and other systems employing an imaging device.

Processor system 300, which may be a digital still or video camera system, may include a lens such as lens 396 for focusing an image onto a pixel array such as pixel array 201 when shutter release button 397 is pressed. Processor system 300 may include a central processing unit such as central processing unit (CPU) 395. CPU 395 may be a microprocessor that controls camera functions and one or more image flow functions and communicates with one or more input/output (I/O) devices 391 over a bus such as bus 393. Imaging device 200 may also communicate with CPU 395 over bus 393. System 300 may include random access memory (RAM) 392 and removable memory 394. Removable memory 394 may include flash memory that communicates with CPU 395 over bus 393. Imaging device 200 may be combined with CPU 395, with or without memory storage, on a single integrated circuit or on a different chip. Although bus 393 is illustrated as a single bus, it may be one or more buses or bridges or other communication paths used to interconnect the system components.

Various embodiments have been described illustrating image sensors with pixel arrays that include both visible and infrared imaging pixels. The pixel array may include an array of photodiodes, an array of filter elements formed over the photodiodes, and an array of microlenses formed over the array of filter elements. The filter elements may include a patterned layer of infrared light blocking material interposed between the array of microlenses and the array of photodiodes. The infrared blocking material may be configured to block infrared light while allowing all wavelengths of visible light to pass. Visible imaging pixels may include a color filter element (e.g., a red filter element, a green filter element, a blue filter element, etc.) and an infrared cutoff filter element formed from the infrared light blocking material. The layer of infrared light blocking material may be patterned to include openings in regions corresponding to infrared imaging pixels in the array. The openings may be filled with an infrared pass filter material that passes infrared light while blocking the transmission of visible light. An image sensor SOC of this type may be capable of simultaneously capturing images in the visible and infrared spectral ranges and may be used in an imaging system such as an electronic device.

A dual bandpass filter may be interposed between a lens and the image sensor. The dual bandpass filter may be a bandpass coating filter that includes multiple layers of coating on a glass plate. Through a process of constructive and destructive interference, the dual bandpass filter may transmit visible light as well as a narrow band of near infrared light while blocking light of other wavelengths.

Near infrared pixels may be scattered throughout the pixel array in any suitable pattern. In one embodiment, the color filter array that is stacked over or under the patterned layer of infrared light blocking material may be formed in a quasi-Bayer pattern. With this type of arrangement, the color filter array is composed of 2×2 blocks of filter elements in which each block includes a green color filter element, a red color filter element, a blue color filter element, and a near infrared filter element in the place where a green color filter element would be located in a typical Bayer array. The infrared light blocking material may overlap the color filter elements, and the openings in the infrared light blocking material may overlap the near infrared filter elements. This is, however, merely illustrative. The density and layout of infrared pixels in the pixel array may be adjusted according to the requirements and/or the desired functionality of the image sensor.

With this type of image sensor, photodiodes of visible imaging pixels may receive visible light only, whereas photodiodes of infrared imaging pixels may receive infrared light only. The image sensor is therefore able to simultaneously capture images in the visible and infrared spectral ranges.

The foregoing is merely illustrative of the principles of this invention which can be practiced in other embodiments.

What is claimed is:

1. An image pixel array, comprising:
   a plurality of photodiodes, wherein the image pixel array includes visible imaging pixels for detecting light in the visible spectrum and infrared imaging pixels for detecting light in the infrared spectrum;
   an array of microlenses, wherein each microlens focuses light onto a respective one of the photodiodes;
   a patterned layer of infrared light blocking material interposed between the array of microlenses and the plurality of photodiodes, wherein the infrared light blocking material transmits visible light and blocks infrared light, wherein the patterned layer of infrared light blocking material includes a plurality of openings, and wherein each opening is aligned with a respective one of the infrared imaging pixels; and
   a plurality of infrared pass filter elements, wherein each infrared pass filter element is formed in a respective one of the openings in the infrared light blocking material, wherein each infrared pass filter element is completely surrounded by the patterned layer of infrared light blocking material, and wherein each infrared pass filter element blocks visible light and transmits infrared light to a respective photodiode associated with the respective one of the infrared imaging pixels.

2. The image pixel array defined in claim 1 wherein each infrared pass filter element comprises black polymer.

3. The image pixel array defined in claim 1 further comprising:
   an array of color filter elements interposed between the array of microlenses and the plurality of photodiodes, wherein each color filter element in the array of color filter elements overlaps a respective portion of the infrared light blocking material.

4. The image pixel array defined in claim 3 wherein the patterned layer of infrared light blocking material is interposed between the array of color filter elements and the plurality of photodiodes.

5. The image pixel array defined in claim 3 wherein the patterned layer of infrared light blocking material is interposed between the array of microlenses and the array of color filter elements.

6. The image pixel array defined in claim 1 wherein the infrared light blocking material comprises photoimageable polymer that passes all wavelengths of visible light.

7. A system, comprising:
   a central processing unit;
   memory;
   input-output circuitry; and
   an imaging device having a pixel array, wherein the pixel array comprises:
      a plurality of photodiodes, wherein the image pixel array includes visible imaging pixels for detecting light in the visible spectrum and infrared imaging pixels for detecting light in the infrared spectrum;
      an array of microlenses, wherein each microlens focuses light onto a respective one of the photodiodes;
      a patterned layer of infrared light blocking material interposed between the array of microlenses and the plurality of photodiodes, wherein the infrared light blocking material transmits visible light and blocks infrared light, wherein the patterned layer of infrared light blocking material includes a plurality of openings, and wherein each opening is aligned with a respective one of the infrared imaging pixels; and
      a plurality of infrared pass filter elements, wherein each infrared pass filter element is formed in a respective one of the openings in the infrared light blocking material, wherein each infrared pass filter element is completely surrounded by the patterned layer of infrared light blocking material, and wherein each infrared pass filter element blocks visible light and transmits infrared light to a respective photodiode associated with the respective one of the infrared imaging pixels.

8. The system defined in claim 7 wherein each infrared pass filter element comprises black polymer.

9. The system defined in claim 7 further comprising:
an array of color filter elements interposed between the array of microlenses and the plurality of photodiodes, wherein each color filter element in the array of color filter elements overlaps a respective portion of the infrared light blocking material.

10. The system defined in claim 9 wherein the patterned layer of infrared light blocking material is interposed between the array of color filter elements and the plurality of photodiodes.

11. The system defined in claim 9 wherein the patterned layer of infrared light blocking material is interposed between the array of microlenses and the array of color filter elements.

12. The system defined in claim 7 wherein the infrared light blocking material comprises photoimageable polymer that passes all wavelengths of visible light.

* * * * *